United States Patent [19]

Griffin et al.

[11] Patent Number: 4,956,308
[45] Date of Patent: Sep. 11, 1990

[54] METHOD OF MAKING SELF-ALIGNED FIELD-EFFECT TRANSISTOR

[75] Inventors: Edward L. Griffin; Robert A. Sadler; Arthur E. Geissberger, all of Roanoke, Va.

[73] Assignee: ITT Corporation, New York, N.Y.

[21] Appl. No.: 4,992

[22] Filed: Jan. 20, 1987

[51] Int. Cl.⁵ .......................................... H01L 21/338
[52] U.S. Cl. ........................................ 437/41; 437/44; 437/45; 437/39; 437/912; 148/DIG. 106; 148/DIG. 105
[58] Field of Search ....................... 29/571, 578, 580; 357/22, 23, 15; 437/40, 41, 45, 39, 912

[56] References Cited

U.S. PATENT DOCUMENTS

| | | | |
|---|---|---|---|
| 4,396,437 | 8/1983 | Kwok et al. | 148/1.5 |
| 4,434,013 | 2/1984 | Bol | 148/1.5 |
| 4,491,860 | 1/1985 | Lim | 357/68 |
| 4,532,695 | 8/1985 | Schmermeyer | 29/571 |
| 4,574,298 | 3/1986 | Yamagishi et al. | 357/71 |
| 4,642,259 | 2/1987 | Vetanen et al. | 428/137 |
| 4,645,563 | 2/1987 | Terada | 437/41 |
| 4,674,174 | 6/1987 | Kishita et al. | 29/578 |

FOREIGN PATENT DOCUMENTS

| | | |
|---|---|---|
| 0211269 | 6/1981 | Japan . |
| 0193069 | 11/1984 | Japan . |
| 0057970 | 4/1985 | Japan . |
| 0145669 | 8/1985 | Japan . |
| 0019177 | 1/1986 | Japan . |

*Primary Examiner*—Brian E. Hearn
*Assistant Examiner*—T. N. Quach
*Attorney, Agent, or Firm*—Thomas N. Twomey

[57] ABSTRACT

A self-aligned gate (SAG) transistor or FET is described which transistor overcomes several disadvantages of the prior art for making SAG field-effect transistors. The disadvantages noted above result from the fact that current SAG FET's have a symmetrical structure, with n+ regions on either side of the gate electrode. This invention provides a means of masking off a region on the drain side of the gate electrode before performing an n+ implant, so that the n+ implanted region is asymmetrical on the two sides of the gate electrode. This has the desired beneficial effect of reducing the parasitic source resistance, without the deleterious effects on gate-drain breakdown voltage, gate-drain capacitance, and output resistance that invariably accompany a high doping level on the drain side of the gate. Using this technique, substantially increased performance can be obtained from a self-aligned FET.

1 Claim, 1 Drawing Sheet

METHOD OF MAKING SELF-ALIGNED FIELD-EFFECT TRANSISTOR

BACKGROUND OF THE INVENTION

This invention relates to field-effect transistors (FET's) and to methods of making such transistors. More particularly, this invention is concerned with a method for making self-aligned gate (SAG) transistors for use in both analog and digital integrated circuits and the resultant structure.

Previous SAG FET's have employed a symmetrical structure, with highly doped n+ regions on either side of the self-aligned gate electrode. Although this structure is relatively simple to fabricate, it has several disadvantages. First, the close proximity of the n+ region to the drain side of the gate causes a large reduction in the gate-drain breakdown voltage, which severely limits the ultimate power-handling capability of the FET. Furthermore, the high doping of the n+ region also increases the gate-drain capacitance. Finally, the close spacing between source and drain n+ regions increases the parasitic substrate current, thereby decreasing the output resistance of the FET. All of these have adverse effects on the performance of a self-aligned FET when used in either analog or digital circuits, but the use of a self-aligned FET to handle high-frequency analog signals is particularly impaired by the above disadvantages of a symmetrical device structure.

Certain copending applications describe pertinent processing techniques also employed in this invention and are generally related to similar devices. For example see a patent application entitled "A Method of Making Self-Aligned GaAs Digital Integrated Circuits" filed on Oct. 21, 1985 as Ser. No. T.Q. 789,523 now abandoned for R. A. Sadler et al. See also a copending application entitled "Methods of Making Self-Aligned GaAs Devices" filed on Jan. 12, 1987, Ser. No. 002,083 now U.S. Pat. No. 4,782,032 for A. E. Geissberger et al. See also a copending patent application entitled "A Method of Making Self-Aligned Field-Effect Transistors" filed on Jan. 12, 1987, Ser. No. 002,084 now abandoned for A. E. Geissberger et al. These applications generally relate to field-effect devices as for example other types of devices relating to those described in this application and utilize similar processing techniques to accomplish certain results, and all of the above applications are assigned to the assignee herein.

BRIEF SUMMARY OF THE INVENTION

A self-aligned gate (SAG) transistor or FET described which transistor overcomes several disadvantages of the prior art for making SAG field-effect transistors. The disadvantages noted above result from the fact that current SAG FET's have a symmetrical structure, with n+ regions on either side of the gate electrode. This invention provides a means of masking off a region on the drain side of the gate electrode before performing an n+ implant, so that the n+ implanted region is asymmetrical on the two sides of the gate electrode. This has the desired beneficial effect of reducing the parasitic source resistance, without the deleterious effects on gate-drain breakdown voltage, gate-drain capacitance, and output resistance that invariably accompany a high doping level on the drain side of the gate. Using this technique, substantially increased performance can be obtain from a self-aligned FET.

OBJECT OF THE INVENTION

It is the object of the present invention to provide a self-aligned gate type field-effect transistor which overcomes the disadvantages of the prior art.

It is an additional object of the present invention to prove a self-aligned device structure in which a highly doped n+ region is present between the source and gate electrodes, but is not present in a region adjacent to the gate electrode on its drain side.

It is yet another object of the present invention to provide a method of manufacturing a field-effect transistor using a single annealing step.

It is an additional object of the present invention to provide a method of producing self-aligned gate field-effect transistors in which the output resistance and the gate-drain breakdown voltage are increased and the gate-drain capacitance is decreased.

It is another object to provide an FET which allows gate line widths of 1 micron or less to be easily defined.

It is yet another object to provide a metal mask which serves as an implant mask, thereby allowing the creation of an implant-to-implant spacing larger than the gate length.

DETAILED DESCRIPTION OF THE FIGURES

Figure 1:
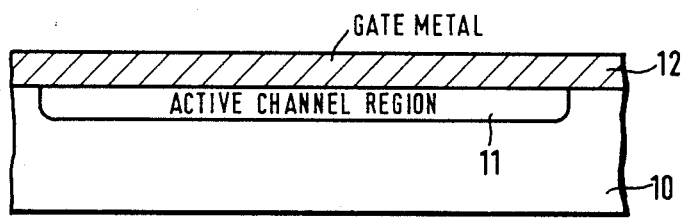
FIGS. 1 to 5 depict various cross sectional views having the processing steps required to provide a field-effect transistor according to this invention with FIG. 5 showing the completed device.

Referring to FIG. 1, there is shown in general a semiconductor wafer or substrate 10.

The wafer 10 may preferably be gallium arsenide GaAs which substrate would initially be cleaned in solvents and then etched to remove that portion of the substrate which may have been damaged by the use of mechanical slurry polishing process.

In any event, the substrate contains an active channel region 11. As one can ascertain from the above-noted copending applications, there are many techniques for providing an active channel region in a substrate such as 10. The fabrication process essentially begins with the formation of the active channel area for the FET.

This may be accomplished by epitaxial layer growth on a suitable substrate, followed by electrical isolation of the intended device area, or alternately, by selective ion implantation of suitable dopants in desired regions of the semiconductor. As indicated, such techniques are well known in the prior art. The entire surface is then coated with a thin layer 12 of suitable metallization having sufficient thermal stability to withstand annealing at temperatures in the range 750 to 950° C. without degradation of its Schottky barrier properties. Examples of Schottky gate metallizations suitable for this purpose are titanium-tungsten, titanium-tungsten nitride, tungsten nitride, and tungsten silicide, although any metallization which will survive the annealed step may be used.

Figure 2:
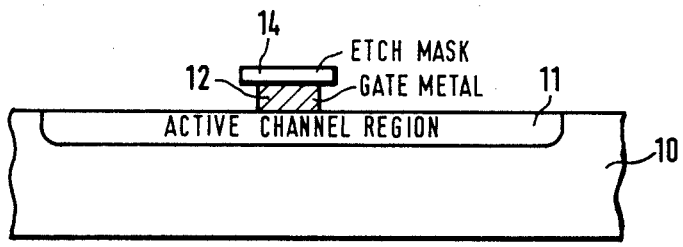

Referring to FIG. 2 the next processing steps are shown.

The gate metallization 12 is patterned into a gate electrode structure for the device. The preferred technique is to define a metal etch mask 14 by the method of evaporation and liftoff. This method is also known as evidenced by the previously identified copending applications. A preferred etch mask material is nickel, although aluminum is also suitable for this purpose. Excess gate metal is then removed by plasma or reactive-ion etchings, leaving gate metal only under the etch mask 12.

Figure 3:
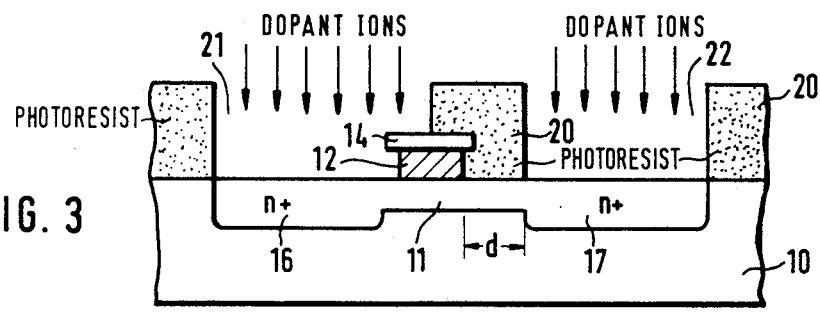

Referring to FIG. 3, the process follows accordingly.

The wafer is then coated with a photoresist 20 and patterned to form openings 21 and 22 on both halves of the device. Suitable dopant ions are then implanted into the semiconductor in the region of the openings 21 and 22 thus forming an asymmetrical device structure with the gate adjacent to the n+ region on its source side 16 but separated from it some distance d on the drain side 17. The preferred distance for this separation is about 1 um, but it could be as little as 0.5 um and as much as the gate-to-drain electrode distance. The preferred dopant ion is silicon, although any n-type dopant ion may be used.

Figure 4:
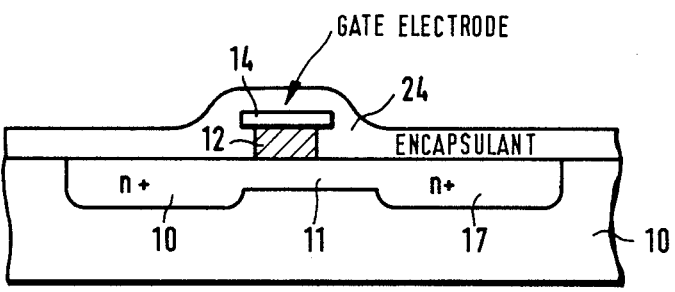

As shown in FIG. 4, the wafer is then encapsulated with a suitable dielectric material 24 in such a way as to cover the gate electrode structure 12. A preferred encapsulant is silicon oxy-nitride, although silicon dioxide and silicon nitride are also suitable for this purpose. The metal etch mask 14 may be removed before performing this encapsulation, although if desired, it may be left in place in order to reduce the overall electrical resistance of the gate electrode, provided the resulting structure is thermally stable in the subsequent annealing step. The encapsulated wafer is then annealed at a temperature and time sufficient to remove ion implant damage from the semiconductor and activate the implanted dopant ions. Preferred annealing temperatures are in the range 750 to 900° C. if done in a conventional furnace system, and 800 to 1000° C. if done in an infra-red lamp system by rapid thermal annealing.

Figure 5:
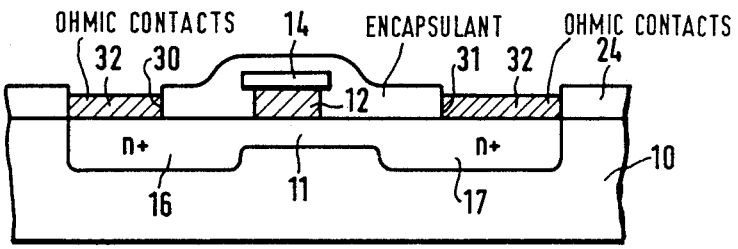

Referring to FIG. 5, after annealing, windows 30 and 31 are patterned in the encapsulant on either side of the gate electrode, and ohmic metallization is deposited in the openings by evaporation and liftoff. The preferred material for these ohmic contacts is a mixture of gold, germanium, and nickel. After patterning, the wafer is heated to a temperature of between 350 and 500° C. to alloy the ohmic contacts, resulting in a finished self-aligned gate FET exclusive of external interconnections to other circuit elements as shown in FIG. 5.

What is claimed is:

1. An improved GaAs FET manufacturing process including the ordered steps of:
   (a) providing a substrate comprising a GaAs region on a first major surface of said substrate, said GaAs region including a channel region;
   (b) providing a gate over said channel region, said gate having a first lateral edge and a second lateral edge;
   (c) providing an implant mask extending laterally over said channel region beyond said second lateral edge of said gate, said mask having source and drain implant openings; and
   (d) introducing impurities via said implant openings into said GaAs region to form source and drain regions, said drain region laterally spaced from said second lateral edge of said gate as a result of said lateral extension of said mask wherein said step of providing an implant mask extending laterally over said channel region beyond said second lateral edge of said gate comprises:

providing a layer of photoresist over said substrate; and patterning said photoresist such that said photoresist extends laterally over said channel region beyond said second lateral edge of said gate and does not extend laterally over said channel region beyond said first lateral edge of said gate.

* * * * *